Figure 1:
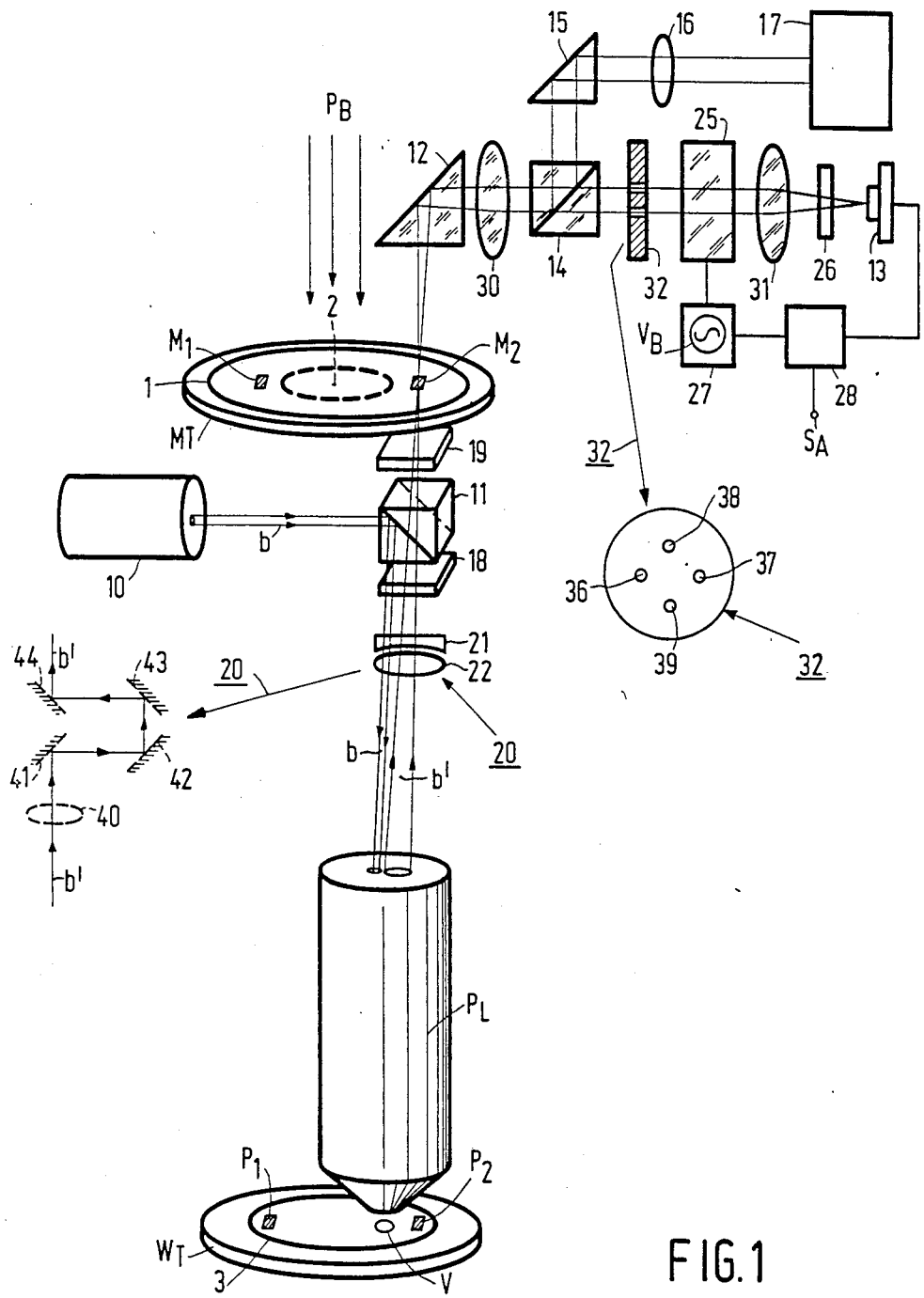

United States Patent [19]
van der Werf

[11] Patent Number: 4,749,278
[45] Date of Patent: Jun. 7, 1988

[54] ARRANGEMENT FOR ALIGNING A MASK AND A SUBSTRATE RELATIVE TO EACH OTHER

[75] Inventor: Jan E. van der Werf, Eindhoven, Netherlands

[73] Assignee: U.S. Philips Corp., New York, N.Y.

[21] Appl. No.: 887,684

[22] Filed: Jul. 21, 1986

[30] Foreign Application Priority Data
Mar. 12, 1986 [NL] Netherlands ................ 8600638

[51] Int. Cl.$^4$ .............................................. G01B 11/00
[52] U.S. Cl. .................................................. 356/401
[58] Field of Search ............... 356/150, 355, 363, 400, 356/401; 250/548, 491.1

[56] References Cited
U.S. PATENT DOCUMENTS
4,251,160 2/1981 Bouwhuis et al. ................ 356/150

*Primary Examiner*—F. L. Evans
*Attorney, Agent, or Firm*—Paul R. Miller

[57] ABSTRACT

An arrangement is described for aligning a mask (1) and a substrate (3) relative to each other by means of grating marks ($M_1$, $M_2$; $P_1$, $P_2$) in the mask and in the substrate. A diaphragm (32) is arranged in the path of the alignment beam (b') behind the mask grating ($M_2$) and transmits only specific diffraction orders of the gratings ($P_2$, $M_2$), so that the alignment signal ($S_A$) contains less undesired components and becomes more accurate.

1 Claim, 2 Drawing Sheets

ARRANGEMENT FOR ALIGNING A MASK AND A SUBSTRATE RELATIVE TO EACH OTHER

The invention relates to an arrangement for aligning a mask and a substrate relative to each other which are both provided with alignment marks in the form of diffraction gratings, which arrangement comprises a radiation source producing an alignment beam, a first lens system for imaging a substrate grating and a mask grating onto each other, a radiation-sensitive detection system in the path of the alignment beam interacting with both the substrate grating and the mask grating, and a diaphragm arranged in the path of the alignment beam issuing from the substrate grating to select radiation being diffracted in specific diffraction orders for the purpose of the alignment.

Such an arrangement is known from U.S. Pat. No. 4,251,160. This Patent describes an arrangement for imaging a mask pattern, for example an IC pattern, repeatedly and to a reduced scale onto the same substrate with, the mask pattern and the substrate being moved relative to each other along two mutually perpendicularly directions in a plane parallel to the substrate plane and the mask plane in the time interval between two succeeding exposures.

Integrated circuits or "ICs" are manufactured by means of diffusing and masking techniques. A number of masks having different mask pattern are then imaged successively at the same locations on a semiconductor substrate. Between the succeeding imaging steps at the same locations the substrate must be subjected to the desired physical and chemical changes. For this purpose the substrate, after it has been exposed by a first mask pattern, must be removed from the exposure apparatus and, after it has been subjected to the desired process steps, it should be replaced therein at the same location in order to expose it by a second mask pattern etc.

As the number of electronic elements per unit area of the substrate increases and the dimensions of these elements decrease accordingly, the requirements imposed on the accuracy with which integrated circuits are fabricated become increasingly stringent. The location where the successive masks are imaged on the substrate should therefore be defined with increasing accuracy.

Diffusion and masking techniques may also be employed in the manufacture of other structures with detail dimensions of the order of micrometers, such as transport patterns and detection patterns of magnetic-domain memories (or magnetic bubble memories), or integrated optical systems. In these cases the accurate alignment of the substrate relative to the mask pattern used in the various process steps may also pose a problem.

U.S. Pat. No. 4,251,160 describes a system for aligning a substrate relative to a mask, in which a diffraction grating provided in the substrate is imaged onto a diffraction grating provided in the mask outside the mask pattern to be imaged. If the image of the substrate grating coincides accurately with the mask grating, the substrate is aligned correctly. The main element for imaging the substrate grating onto the mask grating is the projection-lens system with which the mask pattern is to be imaged onto the substrate. In the known arrangement an "order diaphragm" is arranged between the substrate grating and the mask grating. This order diaphragm is a plate which is opaque to the alignment radiation and which is formed with a plurality of apertures which transmit only these subbeams to the mask grating which are diffracted in the first diffraction orders by the two-dimensional substrate grating. Since only first-order subbeams are employed, the contrast with which the substrate grating is imaged onto the mask grating is enhanced, possible irregularities in the substrate grating do not affect the resulting alignment signal, and the accuracy with which the substrate grating and the mask grating are aligned relative to each other is doubled in comparison with the situation in which no order diaphragm is provided. The zero-order subbeam is also used for imaging the grating. Generally speaking, the use of the order diaphragm results in an improvement in the signal-to-noise ratio of the alignment signal.

In the arrangement in accordance with the U.S. Pat. No. 4,251,160 the order diaphragm is arranged in the projection-lens system itself. This apparatus has proved to be very suitable for use in the fabrication of integrated circuits with minimal details or line widths of the order of one micrometer or more. On account of the increasing demand for more electronic components per unit area of the substrate, i.e. even smaller dimensions of these elements, there is an increasing need for an apparatus which is capable of making repeated images whose details or line widths are smaller than one micrometer.

The projection-lens system for such an apparatus should have a very high resolution, while the image field should be comparatively large, such as of the order of $10 \times 10$ mm$^2$. Not only the fabrication but even the design of such a projection-lens system comprising a large number of lens elements is a very difficult task for the specialised optical industry. If in addition an order diaphragm must be incorporated in the projection lens system, the manufacture of this projection lens system with the desired small tolerances for the elements becomes an almost impossible task.

It is the object of the present invention to mitigate this problem and to provide an alignment arrangement for use in an apparatus for the repeated imaging of a mask pattern onto a substrate, which arrangement does not impose more stringent requirements on the projection-lens system and moreover supplies an improved alignment signal. The arrangement in accordance with the invention is characterized in that a second lens system for imaging the pupil of the first lens system is arranged in the radiation path of the alignment beam between the mask and the detection system, in that the diaphragm is arranged in the plane of the pupil image, and in that the diaphragm comprises apertures at the locations of incidence of beam portions comprising those components of the first order subbeams issuing from the substrate grating which are diffracted in the zeroth order and the first diffraction orders by the mask grating.

The invention is based on the recognition of the fact that a suitably adapted order diaphragm arranged in an image of the pupil of the projection lens system cannot only perform the function of the diaphragm arranged in the projection lens system of the known arrangement but even performs this function in a better manner.

It is to be noted that the article "An Improved Alignment System for Watersteppers", in "SPIE, Vol. 470, Optical Microlithography III: Technology for the Next Decade", 1984, pages 62–69, with reference to FIG. 2, describes an alignment arrangement in which a substrate grating is imaged onto a mask grating with, a diaphragm being arranged between the mask and the radiation-sensitive detection system. However, this diaphragm has only one central aperture which transmits only the zero-order subbeam; and the first-order subbeams cannot reach the detection system. Moreover, this article does not state that the diaphragm must be arranged in the image of the pupil of the projection-lens system.

Figure 2:
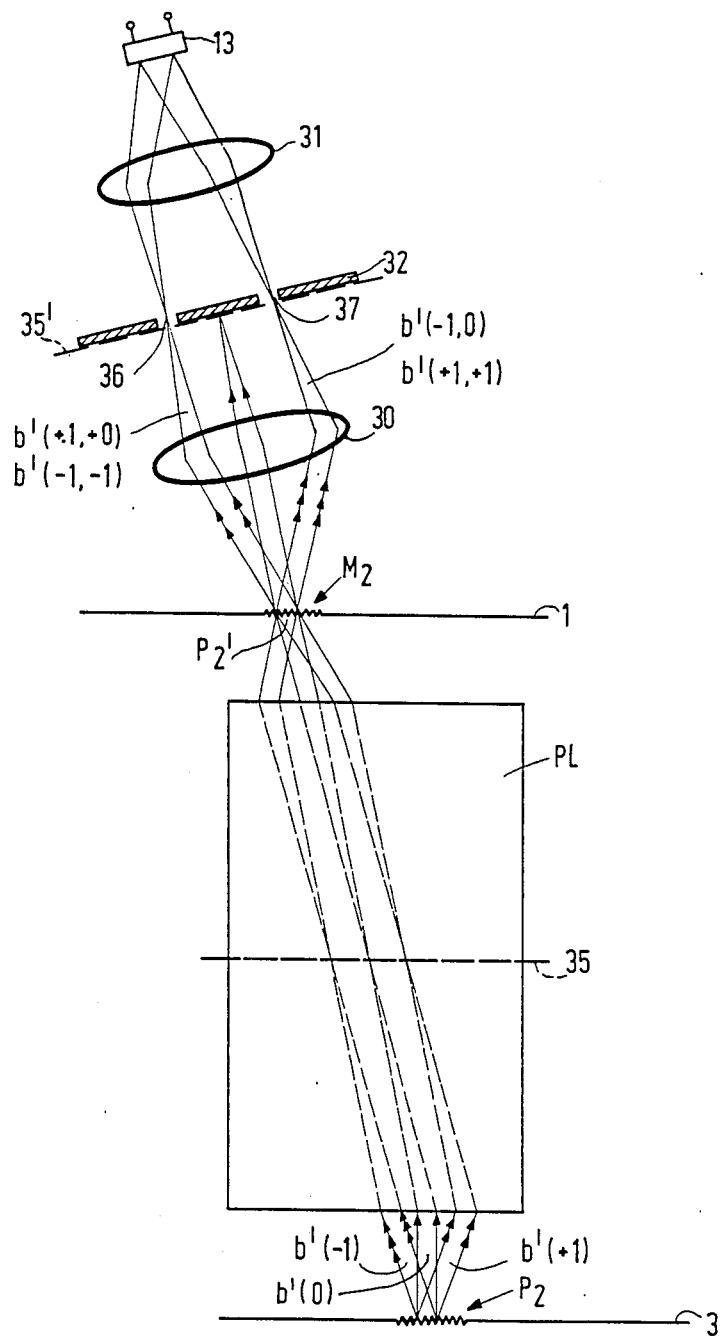

An embodiment of the invention will now be described in more detail, by way of example, with reference to the accompanying drawings, in which FIG. 1 shows an embodiment of the invention, and FIG. 2 shows the radiation path with the imaging elements of this arrangement to illustrate the inventive principle.

In FIG. 1 a mask 1 comprises two alignment marks $M_1$ and $M_2$ in the form of diffraction gratings. Between these marks an IC pattern 2 is represented schematically as a dashed curve. A plurality of images of this pattern must be formed adjacent each other on a semiconductor substrate 3 which also comprises a number of alignment marks in the form of diffraction gratings, of which two gratings $P_1$ and $P_2$ are shown. The gratings $P_1$ and $P_2$ are situated outside the areas on the substrate where the images of the pattern 2 must be formed. The gratings $M_1$ and $M_2$ are, for example, amplitude gratings and the gratings $P_1$ and $P_2$ are phase gratings. For the advantages of the grating marks in comparison with other marks such as cross-lines, reference is made to U.S. Pat. No. 4,251,160. When the IC pattern 2 is imaged onto the substrate 3, the projection beam PB issuing from a radiation source, not shown, only illuminates the pattern 2. The gratings $M_1$ and $M_2$ are not imaged.

FIG. 1 shows only those optical elements which are employed for detecting deviations between the desired and the actual positions of the gratings relative to one another. Of the mechanical elements which serve for positioning the substrate and the mask correctly relative to one another only the mask table MT and the substrate table WT are shown. All the optical elements except for the radiation source 10 are accommodated in a projection column, not shown. This column and the substrate table are movable relative to one another in two mutually perpendicular directions X and Y which are parallel to the plane of the substrate table.

For particulars on the sequence in which the various gratings are aligned relative to each other, the manner in which the substrate table is moved relative to the projection column and the manner in which these movements are controlled reference is made to U.S. Pat. No. 4,251,160. The present invention only relates to an arrangement by means of which the substrate gratings $P_1$ and $P_2$ are aligned relative to the mask gratings $M_1$ and $M_2$.

As is shown in FIG. 1, the present arrangement comprises a radiation source 10, for example a helium-neon laser, which emits an alignment beam b. A beam splitter 11, suitably a polarisation-sensitive prism, reflects this beam to the substrate 3. A lens system PL, which is the projection-lens system which images the mask pattern 2 onto the substrate 3, focuses the beam b to form a small radiation spot V having a diameter of, for example, 1 mm onto the substrate. This substrate reflects the beam as a beam b' towards the mask 1. The beam b' traverses the projection-lens system again, and this system images the radiation spot V onto the mask. The substrate is pre-aligned, for example by means of an apparatus as described in the Applicant's European patent application No. 0,164,165 which has been laid open to public inspection, in such a way that the radiation spot V is situated on the grating mark $P_2$. Thus, the substrate grating $P_2$ is imaged onto the mask grating $M_2$ as a grating $P_2'$.

A $\lambda/4$ plate 18, where $\lambda$ is the wavelength of the beam b is arranged in the radiation path between the polarisation-sensitive splitter prism 11 and the projection-lens system PL, the optic axis of this plate being disposed at an angle of 45° to the direction of polarisation of the beam b issuing from the source 10. On its way to the substrate and back the beam traverses the $\lambda/4$ plate 18 twice so that the direction of polarisation of this beam is rotated through 90° in total and the beam reflected by the substrate 3 is transmitted to the mask 1. The combination of the polarisation-sensitive prism 11 and the $\lambda/4$ plate has the advantage of a minimal radiation loss. It is also possible to employ a polarisation-neutral beam splitter, such as for example a semitransparent mirror.

Since the projection lens system PL has been designed for the wavelength of the projection beam PB which should be as small as possible in view of the desired high resolution and since alignment is effected with a beam b having a different wavelength, the magnification with which the system PL images the grating $P_2$ may deviate slightly from the desired magnification and, moreover, the image $P_2'$ may be situated slightly outside the plane of the mask 1. In order to compensate for this a system 20 which comprises at least two elements is arranged in the path of the beam b'. This system may comprise two lenses 21 and 22 which in conjunction with the projection-lens system PL ensure that the image $P_2'$ has the correct size and is formed at the correct axial position. Instead of two lenses the compensation system may comprise a combination of a lens 40 and a plurality of mirrors 41, 42, 43 and 44, as is indicated in broken lines in the left-hand part of FIG. 1.

For a description of the grating geometries reference is made to U.S. Pat. No. 4,251,160. It is to be noted that the gratings are two-dimensional gratings, i.e. that they comprise subgratings with mutually perpendicular grating lines which extend in the X-direction and the Y-direction and that the grating period of the grating $M_2$ is adapted to that of the grating $P_2$.

The beam b' transmitted by the grating $M_2$ is reflected towards a radiation-sensitive detector 13, for example a photodiode, by a prism 12 with the output signal of the detector being a measure of the registration of the grating $M_2$ with the image of the grating $P_2$. A beam splitter 14 which splits off a part of the radiation may be arranged between the prism 12 and the detector 13. By a reflecting prism 15 and, if required, a lens 16 this split-off portion of the radiation is directed to a TV camera 17 which is coupled to a monitor, not shown, on which the gratings $M_2$ and $P_2$ are displayed for the operator of the apparatus.

The alignment accuracy is improved substantially by modulating the output signal of the detector 13 with a fixed frequency. For this purpose, as is described in the article in "SPIE Vol. 470, Optical Microlithography", 1984, pages 62-69, the mask 1 and hence the grating $M_2$ may be moved periodically. A better alternative in order to obtain a dynamic alignment signal, which method is described in U.S. Pat. No. 4,251,160, is illustrated in FIG. 1. Before reaching the grating $M_2$ the beam b' first traverses the $\lambda/4$ plate 18 and the polarisation-sensitive prism 11, so that the beam is linearly polarised with a specific direction of polarisation, and subsequently it traverses a birefringent plate 19, for example, a quartz plate whose optic axis is disposed at an angle of 45° to the specific direction of polarisation. Two beams which are polarised perpendicularly relative to each other emerge from the plate 19 and at the location of the grating $M_2$ they are spaced from each other by a distance equal to half the grating period of this grating. The detector 13 may be preceded by a polarisation modulator 25, for example, an elasto-optical modulator and an analyser 26. The modulator is driven by a voltage $V_B$ supplied by a generator 27. As a result of this, the direction of polarisation of the beam issuing from the modulator is alternately shifted through 90°. The analyser 26 has the same principal direction or direction of transmission as the prism 11, so that a first beam, which has a first direction of polarisation and which has formed a non-shifted image of $P_2$ on $M_2$, and a second beam, which has a second direction of polarisation and which has formed an image shifted by half a grating period on $M_2$ are alternately transmitted to the detector. The signal from the detector 13 is amplified and processed in the phase-sensitive detection circuit 28, to which the signal $V_b$ is also applied. The output signal $S_A$ of the circuit 28 is the desired dynamic alignment signal.

In accordance with the invention the pupil of the projection lens system PL is imaged at a position between the mask and the detection system 13 and a diaphragm 32 is arranged in the plane of this image. For this purpose two lenses 30 and 31 are arranged in the radiation path behind the mask 1. The functions of these lenses and of the diaphragm are best illustrated with reference to FIG. 2, which schematically shows the elements involved in imaging.

In FIG. 2 the projection-lens system is again designated PL. This system comprises a large number of lens elements, which are not shown separately. The system PL has an exit pupil which, viewed from the mask 1, is situated in the plane 35. This means that the plane 35 is the plane in which the exit pupil is imaged by the lens elements which are situated above this plane.

The substrate grating $P_2$ splits the beam reflected by this grating into a zero-order subbeam b' (0), two first-order subbeams b' (+1) and b' (−1) and a plurality of higher-order subbeams which are irrelevant to a correct understanding of the present invention and are therefore not shown. All these subbeams together produce a faithful image $P_2'$ of the grating $P_2$ in the plane of the mask 1. This image is formed by the projection-lens system PL. Care is taken that the image $P_2'$ coincides with the grating $M_2$ when the substrate and the mask are aligned correctly relative to each other. As is shown in FIG. 2, the subbeams b' (0), b' (+1) and b' (−1) diffracted in the various diffraction orders are spatially separated from each other in the plane 35. Therefore, it is possible to arrange a diaphragm in this plane, which diaphragm has apertures at the locations where the subbeams b' (+1) and b' (−1) are incident, so that the zero-order subbeam and the second-order and higher-order subbeams are suppressed. The zero-order subbeam does not contain any information on the position of the grating $P_2$. Depending on the geometry of this grating, in particular the depth of the grating grooves and the ratio between the width of the grating grooves and the width of the intermediate strips, the intensity of this beam may be considerable in comparison with the intensities of the first-order subbeams. By suppressing the zero-order subbeam the contrast in the image $P_2'$ can be enhanced considerably. Since the second-order and higher-order subbeams are suppressed, irregularities in the grating $P_2$ do not affect the alignment signal. By using only the first-order subbeams the second harmonic of the grating $P_2$ is. In effect, imaged, in other words when the magnification M of the projection lens system PL is ignored, the image $P_2'$ has a period which is half that of the grating $P_2$. If the grating period of the grating $M_2$ is equal to that of the image $P_2'$, i.e. equal to $\frac{1}{2}M$ times the grating period of the grating $P_2$, the accuracy with which the gratings $M_2$ and $P_2$ are aligned is twice as large as in the case that the entire beam b' is used for imaging.

In accordance with the invention a diaphragm which performs the above function is arranged outside the projection lens system PL. This diaphragm can perform its function only if it is arranged in a plane where the different diffraction orders are adequately separated. Such a plane is obtained by means of the lens 30 which images the plane 35 inside the projection-lens system, i.e. the plane of the pupil of this system into the plane 35'. The diaphragm 32 is arranged in the latter plane. The second lens 31 together with the lens 30 ensures that the grating $M_2$ and, superposed on it, the image $P_2'$ of the grating $P_2$ are imaged on the detector 13. The diaphragm 32 has apertures 36 and 37.

Since the beam b' is not filtered before it is incident on the grating $M_2$, it contains, in principle, all diffraction orders. The grating period of the grating $M_2$ determines the angles at which the subbeams of the various diffraction orders are diffracted by this grating. Together with the positions of the apertures 36 and 37 this grating therefore determines which of the subbeams issuing from the substrate grating $P_2$ and the mask grating are transmitted to the detector 13. Care is taken that those portions of the first-order subbeams from the grating $P_2$ which are not diffracted by the grating $M_2$, i.e. the zero-order components of the beams b' (+1) and b' (−1), are transmitted by grating $M_2$. These beam components are represented as b' (+1,0), b' (−1,0), in which the second index denotes the diffraction order of the mask grating $M_2$.

As the components of the beam b' (+1) diffracted in the +1 order by the grating $M_2$, i.e. the subbeam b' (+1,+1), coincides with the subbeam b' (−1,0), the subbeam b' (+1,+1) is also transmitted by the aperture 37. The component of the subbeam b' (−1) which is diffracted in the −1 order by the grating $M_2$, i.e. the subbeam b' (−1,−1) coincides with the subbeam b' (+1,0), so that the subbeam b' (−1,−1) is transmitted to the detector by the aperture 36.

All the radiation, except for the subbeams b' (+1) and b' (−1), which is incident on the grating $M_2$ and which is transmitted by this grating in the zeroth order, is blocked by the diaphragm 32. This results in a further enhancement of the contrast of the image on the detector. The radiation which is incident on the grating $M_2$ and which is diffracted, in the second order or higher orders by this grating cannot traverse the diaphragm, so that irregularities in the mask grating $M_2$ cannot influence the alignment signal. The part of the zero-order subbeam b' (0) which issues from the grating $P_2$ and which is diffracted in the +1 order or the −1 order by the grating $M_2$, if it can enter the lens 30 at all, cannot reach the apertures 36 and 37. It is ensured that the components of the first-order subbeams which issue from the grating $P_2$ and which are diffracted in the zeroth-order and first orders by the grating $M_2$ are transmitted to the detector with all the consequent advantages.

It is to be noted that FIG. 2 illustrates the situation in one plane only. Since the gratings $P_2$ and $M_2$ are two-dimensional gratings, diffraction also occurs in a second plane perpendicular to the plane of drawing in FIG. 2. In addition to the apertures 36 and 37 the diaphragm 32 comprises two further apertures 38 and 39 which, in the same way as the apertures 36 and 37 for the first dimension, transmit similar diffraction orders for the second dimension.

The above considerations for the alignment of the substrate grating $P_2$ relative to the mask grating $M_2$ obviously also apply to the alignment of the substrate grating $P_1$ relative to the mask grating $M_1$.

As the present alignment system operates independently of the type of pattern 2 in the mask 1, the invention may be utilized in all cases where a pattern of very fine detail should be transferred to a substrate and should be aligned very accurately relative to the substrate. Examples of these are apparatus employed in the fabrication of integrated optical system or of magnetic-domain memories.

What is claimed is:

1. In an arrangement for aligning a mask and a substrate relative to each other, said mask and substrate being provided with alignment marks of diffraction gratings, said arrangement comprising:

radiation source means for producing an alignment beam, first lens system means for imaging a substrate grating onto a mask grating, radiation-sensitive detection means receiving said radiation after being diffracted in specific diffraction orders by both said substrate grating and said mask grating for measuring registration of said substrate grating and said mask grating, and diaphragm means arranged before said radiation-sensitive detection means for selecting radiation diffracted in said specific diffraction orders by said substrate grating and said mask grating, wherein the improvement comprises second lens system means arranged between said mask and said radiation-sensitive detection means for providing a pupil image of said first lens system means, wherein said diaphragm means is disposed after said mask in the plane of said pupil image, and wherein said diaphragm means has a plurality of apertures for only passing subbeams of the first diffraction order from said substrate grating for zero order radiation and for first order radiation diffracted by said mask grating.

* * * * *